(12) United States Patent
Perkins (10) Patent No.: US 8,895,994 B2
(45) Date of Patent: Nov. 25, 2014

(54) ELECTRONIC DEVICE INCLUDING SILICON CARBIDE DIODE DIES

(75) Inventor: Luke Perkins, Plainsboro, NJ (US)

(73) Assignee: Schlumberger Technology Corporation, Sugar Land, TX (US)

( * ) Notice: Subject to any disclaimer, the term of this patent is extended or adjusted under 35 U.S.C. 154(b) by 32 days.

(21) Appl. No.: 13/535,025

(22) Filed: Jun. 27, 2012

(65) Prior Publication Data

US 2014/0001488 A1    Jan. 2, 2014

(51) Int. Cl.
*H01L 21/50*    (2006.01)
*H01L 29/161*    (2006.01)

(52) U.S. Cl.
USPC .............. 257/77; 257/E21.499; 257/E29.084; 438/107

(58) Field of Classification Search
CPC .............................. H01L 21/50; H01L 29/161
USPC .............. 257/675, E21.499, E23.031, 77, 99, 257/E33, 686, 98, E33.061, 401, 692, 704, 257/E33.06, E23.18, E23.01; 438/107, 27; 363/126, 132
See application file for complete search history.

(56) References Cited

U.S. PATENT DOCUMENTS

| | | | |
|---|---|---|---|
| 4,774,103 A | 9/1988 | Kamigaito et al. | |
| 5,191,517 A | 3/1993 | Stephenson | |
| 5,523,939 A | 6/1996 | Stephenson | |
| 6,522,080 B1 | 2/2003 | Faillon et al. | |
| 7,768,104 B2 | 8/2010 | Chou et al. | |
| 2002/0149021 A1* | 10/2002 | Casady et al. | 257/77 |
| 2003/0099120 A1* | 5/2003 | Yu | 363/50 |
| 2007/0096284 A1* | 5/2007 | Wallace | 257/686 |
| 2007/0215896 A1* | 9/2007 | Sun et al. | 257/99 |
| 2008/0179611 A1* | 7/2008 | Chitnis et al. | 257/98 |
| 2008/0297071 A1* | 12/2008 | Ray et al. | 315/312 |
| 2009/0236705 A1* | 9/2009 | Chou et al. | 257/675 |
| 2010/0200932 A1* | 8/2010 | Ueda | 257/401 |
| 2010/0328975 A1* | 12/2010 | Hibino et al. | 363/126 |

FOREIGN PATENT DOCUMENTS

RU            102274 U1       2/2011

OTHER PUBLICATIONS

Sadchenkov, D. "Umnozhiteli naprazheniya," Moskva, Radio No. 10, 2000, fig. 1, 2.
Medvedev, A. "Elektronnye komponenty i montazhnye podlozhiki. Postoyannaya itegratsiya. Komponenty i tekhnologii," No. 12, 2006, razdel "konstruktsii korpusov mikroskhem" drawing 4, 15.

(Continued)

*Primary Examiner* — David Vu
*Assistant Examiner* — Mouloucoulaye Inoussa
(74) *Attorney, Agent, or Firm* — Cathy Hewitt (57) ABSTRACT

An electronic device may include an elongated dielectric substrate having opposing first and second ends, a plurality of conductive pads longitudinally spaced apart along the elongated dielectric substrate, and a plurality of silicon carbide (SiC) (e.g., PiN) diode dies. Each SiC die may have bottom and top diode terminals and may be mounted on a respective conductive pad with the bottom diode terminal in contact therewith. The electronic device may further include at least one internal wirebond between the corresponding conductive pad of one SiC diode die and the top diode terminal of a next SiC diode die, a first external lead electrically coupled to the top diode terminal of a first SiC die and extending longitudinally outwardly from the first end, and a second external lead electrically coupled to the corresponding contact pad of a last SiC diode die and extending longitudinally outwardly from the second end.

19 Claims, 6 Drawing Sheets

(56) References Cited

OTHER PUBLICATIONS

High Voltage Diodes. Creative Science & Research, 2004, par. "6000 volt Diode bank", 12 pages.

Anufriev, L.P. et al. Tekhnologiya izdely integralnoi elektroniki: uchebnoe posobie po distsipline "Konstruirovanie i tekhnologiya izdely integralnoi elektroniki" dlya studentov spetsialnostei "proektirovanie i proizvodstvo RES", Elektronno-opticheskie sistemy i tekhnologii, Minsk, "Integralpoigraf" 2009 p. 317-318, drawing 12.9.

International Search Report and the Written Opinion for International Application No. PCT/US2013/048022 dated Oct. 18, 2013.

* cited by examiner

ELECTRONIC DEVICE INCLUDING SILICON CARBIDE DIODE DIES

BACKGROUND

Voltage multipliers are used to create a relatively high DC voltage from an AC power source. Such devices are used in a variety of applications ranging from particle accelerators to more commonplace electronic devices such as photocopiers.

One particular application in which particle accelerators are used is for nuclear-based borehole logging measurements in hydrocarbon resource wells (e.g., oil or natural gas wells). One such miniature, borehole-size particle accelerator is a neutron generator which utilizes the fusion of deuterium and tritium ion at high (100 keV) energies. This device irradiates the formation with 14 MeV neutrons which can be reflected and/or attenuated and, when measured, provide an indication of the hydrogen content of the formation; alternately, the stimulated gamma radiation response from the formation can be measured to provide, among other, an elemental composition of the formation.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

An electronic device is provided herein which may include an elongated dielectric substrate having opposing first and second ends, a plurality of conductive pads longitudinally spaced apart along at least one surface of the elongated dielectric substrate, and a plurality of silicon carbide (SiC) diode (e.g., PiN diode) dies (a.k.a., junctions). Each SiC die has opposing bottom and top terminals (e.g., anode and cathode) and may be mounted on a respective conductive pad with the bottom (e.g., the cathode) diode terminal in contact therewith. The electronic device may further include at least one internal wirebond between the corresponding conductive pad of one SiC diode die and the top diode terminal of a next SiC diode die, a first external lead electrically coupled to the top terminal of a first SiC die and extending longitudinally outwardly from the first end of the elongated substrate, and a second external lead electrically coupled to the corresponding contact pad of a last SiC diode die and extending longitudinally outwardly from the second end of the elongated substrate. By way of example, a conductive termination pad may also be positioned on the substrate and coupled to first external lead, and a wirebond may be coupled between the conductive termination pad and the top terminal of the first SiC die.

A related voltage multiplier circuit converts a first AC voltage to a second, higher DC voltage. The voltage multiplier circuit may include an input to receive the first voltage and an output to output the second voltage, and a plurality of capacitors and high voltage diodes (such as the electronic device described briefly above) electrically connected in an alternating fashion between the input and the output.

A related method is for making a high voltage diode. The method may include forming a plurality of conductive pads longitudinally spaced apart along an elongated dielectric substrate, where the elongated dielectric substrate having opposing first and second ends. The method may further include mounting a plurality of SiC diode (e.g., PiN) dies on respective conductive pads, with each SiC die having bottom and top diode terminals and being mounted on a respective conductive pad with the bottom diode terminal in electrical contact therewith. The method may further include positioning at least one internal wirebond between the corresponding conductive pad of one SiC diode die and the top diode terminal of a next SiC diode die. The method may also include electrically coupling a first external lead to the top diode terminal of a first SiC die and extending longitudinally outwardly from the first end of the elongated substrate, and electrically coupling a second external lead to the corresponding contact pad of a last SiC diode die and extending longitudinally outwardly from the second end of the elongated substrate.

DETAILED DESCRIPTION

The present description is made with reference to the accompanying drawings, in which example embodiments are shown. However, many different embodiments may be used, and thus the description should not be construed as limited to the embodiments set forth herein. Rather, these embodiments are provided so that this disclosure will be thorough and complete. Like numbers refer to like elements throughout, and prime and multiple prime notation are used to indicate similar elements in different embodiments.

Figure 1:
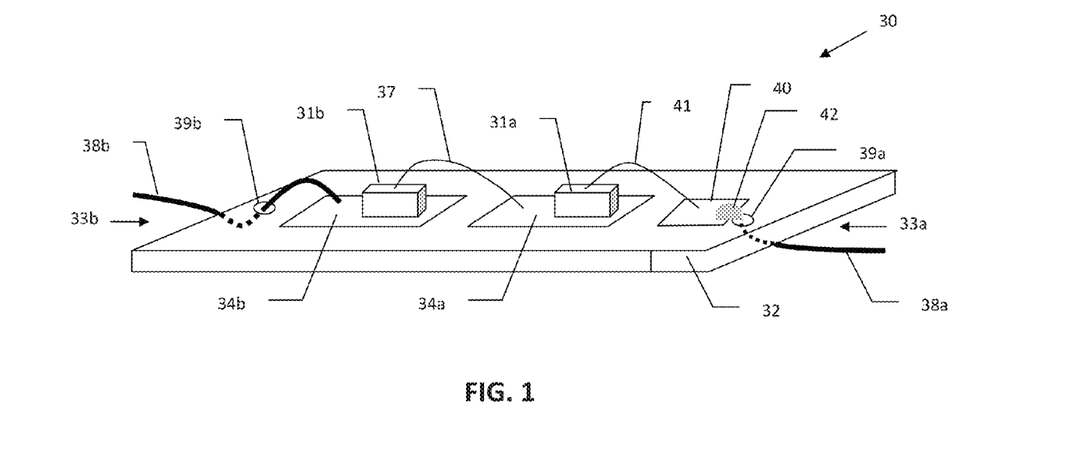
FIG. 1 is a perspective view of an electronic device in accordance with an example embodiment.
Figure 2:
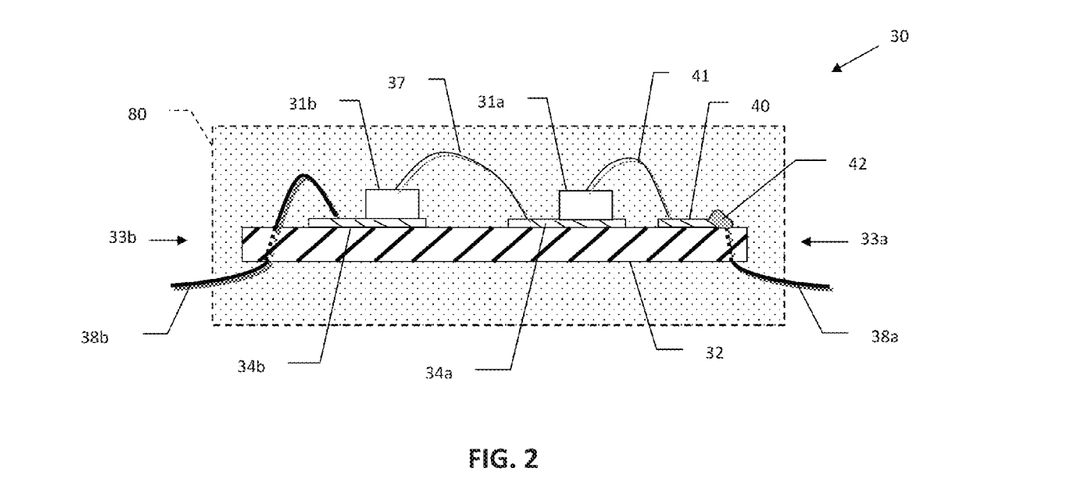
FIG. 2 is a schematic cross-sectional diagram of the electronic device of FIG. 1 in which the components are encapsulated within a dielectric encapsulant.
Figure 3:
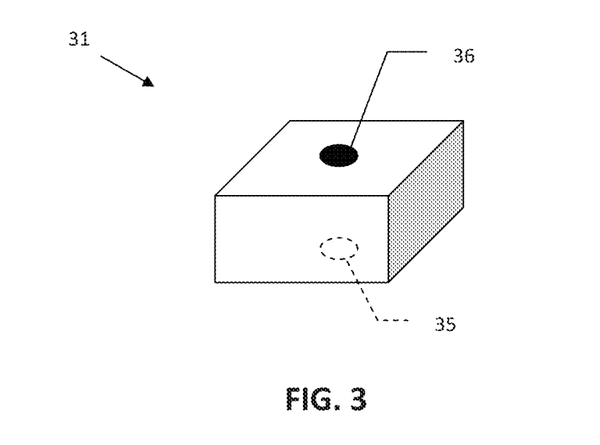
FIG. 3 is a perspective view of an example SiC diode PiN die which may be used with the electronic device of FIG. 1.

Referring initially to FIGS. 1-3, an electronic device 30 which may be used as a high voltage rectifier diode is first described. By way of background, high voltage (HV) diodes (a.k.a. rectifiers) are a component of voltage multipliers, such as Cockcroft-Walton voltage multipliers (a.k.a., HV ladders). High voltage diodes used in such applications may be silicon-based, a material which has a relatively small band-gap, and are axial-leaded. At elevated temperatures (e.g., >175° C.), Si diodes will begin to fail by conducting current in a reverse bias mode, leading to a thermal runaway condition (with the self-induced heating).

Silicon carbide SiC has been identified as a material suitable for making PiN junction diodes for relatively high temperature (e.g., >200° C.) applications, given its large band gap (e.g., 3.1 eV compared to 1.1 eV for Si diodes). Additional advantageous properties of SiC include chemical stability, high temperature endurance and radiation hardness. Single SiC dies (a.k.a., junctions) may also be produced to withstand high voltage hold off to a few kilovolts.

Generally speaking, the present disclosure relates to an electronic device 30, which illustratively includes a plurality or array of SiC diode dies 31a, 31b connected in series, such as in a multi-chip module (MCM) style configuration on an insulating or dielectric (e.g., ceramic) substrate to provide a high temperature, high voltage diode. However, it should be noted that other components than the SiC diode dies 31a, 31b may also be included within the electronic device 30 in some embodiments, such as an inductor(s) (e.g., a serpentine trace), which may help reduce an overall parasitic, junction, or other capacitance, or other components, for example. The dielectric substrate 32 is elongated and has opposing first and second ends 33a, 33b, and a plurality of conductive pads or landings 34a, 34b longitudinally spaced apart along the elongated dielectric substrate. The conductive pads 34a, 34b may comprise metallization pads on the ceramic substrate 32, for example. Each SiC diode die 31 has bottom (generally the cathode) and top (generally the anode) terminals 35, 36 (see FIG. 3) and is mounted on a respective conductive pad 34a, 34b with the bottom diode terminal in contact therewith.

The electronic device 30 further illustratively includes one or more internal wirebonds 37 connected or coupled between the corresponding conductive pad 34a of the SiC diode die 31a and the top diode terminal 36 of the next SiC diode die 31b in the series of diode dies. Multiple wirebonds may be used in some embodiments to provide redundancy, if desired. The wirebond lengths and shapes may be selected to provide large enough "loops" to avoid shorting on the edges of the diode dies 31a, 31b, etc., while at the same time keeping angles as shallow as possible so as to not protrude and thereby increase the physical size of the device. A wirebonding machine may be programmed to provide the desired wire layouts, or they may be created manually in some embodiments. In the illustrated example, the series includes the two diode dies 31a, 31b, but in other embodiments additional diode dies may be connected in the series in a similar fashion. That is, the design is scalable by adding more SiC diode dies 31 to increase the overall voltage rating of the diode as desired. Moreover, other diode die types may be used in a different embodiment, such as gallium arsenide (GaAs) dies, for example.

A first external lead 38a is electrically coupled to the top diode terminal 36a of the first SiC die 31b in the series by way of a conductive termination pad 40 and a wirebond 41. More particularly, the first external lead 38a may connected to the termination pad 40 by conductive solder 42, conductive paste, spot welding, etc., and the first external lead extends longitudinally outwardly from the first end 33a of the elongated substrate 32. A second external lead 38b is electrically coupled to the corresponding contact pad 34b of a last SiC diode die 31b in the series, and the second external lead extends longitudinally outwardly from the second end 33b of the elongated dielectric substrate 32. As such, the first and second external leads 38a, 38b are radial or axial leads, which may allow for relatively easy connectivity of the electronic device 30 to other circuit components.

By way of example, the wirebonds 37, 41 are wires which may range from about 0.5 to 10 mils in diameter, whereas the first and second external leads may be larger, e.g., 20 mil diameter. Thus, the conductive pads 40, 34b allow for intermediate connection points from the first and second external leads 38a, 38b to respective dies 31a, 31b, as the relatively small top (e.g., anode) terminals 36 may be more appropriate for the smaller wirebonds to avoid potential shorting problems. The termination pad 40 is sized so that there is room for both the wirebond(s) 41 and the first external lead 38a to be connected thereto.

Figure 4:
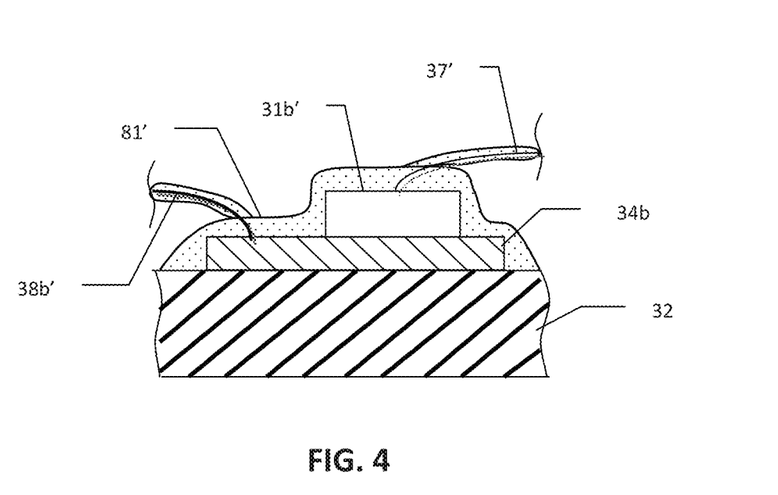
FIG. 4 is a schematic cross-sectional diagram of an embodiment of the electronic device of FIG. 1 in which SiC diode dies and wire bonds are coated with a dielectric coating.
Figure 5:
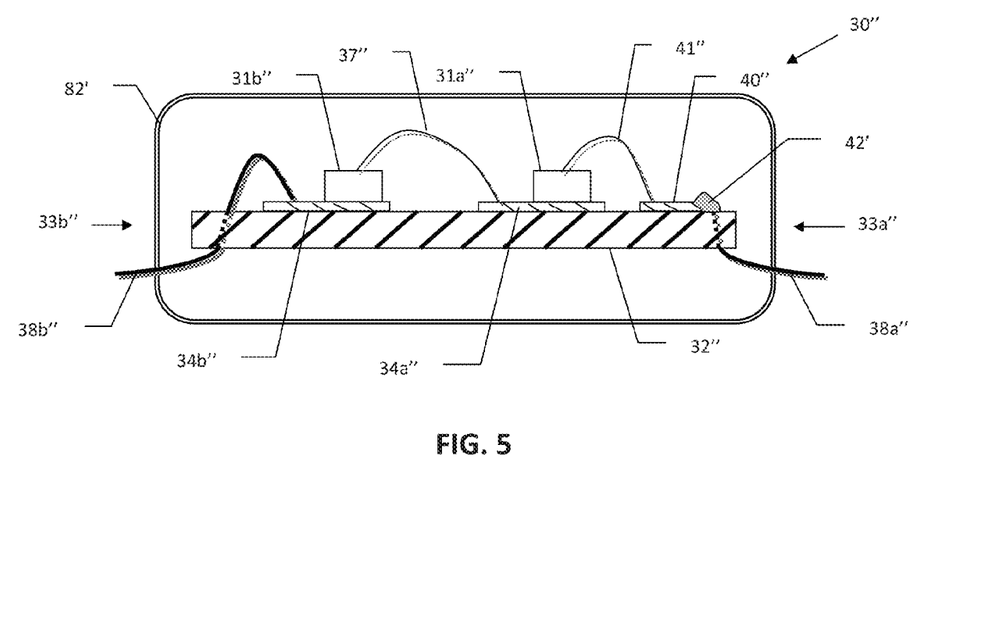
FIG. 5 is a schematic cross-sectional diagram of an embodiment of the electronic device of FIG. 1 except without the encapsulant but rather within a vacuum casing.

To help protect the first and second leads 38a, 38b, these leads may optionally be routed through respective passageways or vias 39a, 39b through the substrate 32. In the example of FIG. 2, a dielectric encapsulant 80 surrounds the elongated dielectric substrate 32, conductive pads 34a, 34b, the SiC diode dies 31a, 31b, and the internal wirebond 37 (as well as portions of the first and second leads 38a, 38b). The encapsulant 80 may advantageously help protect the electronic device 30, particularly the wirebonds, and help prevent electrical or mechanical failures of the various wirebonds or terminals, as will be discussed further below. In an embodiment shown in FIG. 4, a dielectric coating 81' may similarly be used on the SiC diode dies and the internal wirebond 37'. In still another embodiment shown in FIG. 5, the electronic device 30" may further include a casing 82" (e.g., glass) surrounding the elongated dielectric substrate 32" and defining a vacuum therein to provide mechanical and/or electrical protection. It should be noted that variations of the substrate 32" shape may be used to accommodate features such as the casing 82", or other components such as axial leads, an encapsulant, etc., in various embodiments. For example, a disc or flange may be incorporated perpendicular and at the end of the substrate 32" to provide support to the casing 82". Similarly, the substrate may be shaped longitudinally into a through/channel to protect one or more wirebonds and to contain any potting/encapsulant.

For comparison purposes, it is helpful to understand how a silicon HV diode is manufactured. There are several steps in the manufacturing process, but only those pertinent to this discussion are provided herein. The HV silicon diode includes several (e.g., 1 to 2 dozen) dies stacked end to end (e.g., cathode to anode), with leaded terminations at each end of the overall assembly. For example, a 10 kV HV diode is approximately 0.5 inches long×0.125 inch diameter. The die stack is manufactured from a stack of large diameter (e.g., 3 inches) pure silicon wafers (about 0.25 mm thick). Boron (powder), the dopant, is spread on each wafer surface and is thus sandwiched between each silicon wafer making up the stack. The whole stacked wafer assembly is then baked in a high temperature furnace to allow the dopant to diffuse into the silicon to create the desired diode semiconductor properties. Following this, the processed stack of wafers is then diced (e.g., with a thin-blade diamond saw) into the individual HV diode bodies (about 1 mm$^2$) and subsequently (acid) cleaned before lead attachment and encapsulation.

Aside from the intrinsic semiconductor properties of the silicon HV diodes, suitable high voltage performance in the form of high bulk dielectric breakdown voltage (i.e., electrical hold off) and good surface creep or tracking resistance may be an issue. Generally, tracking is a consideration given that upwards of 1000 volts may be applied across each approximately 0.25 mm thin die. Any contaminants from the cutting operation (e.g., cutting fluid residue and smearing of the cutting blade), as well as impurities and residual voids in the encapsulant, may adversely affect diode HV performance by increasing HV leakage currents around the body.

With traditional silicon diodes, to achieve a higher voltage rating, more silicon dies (i.e., wafers) are added in the stack. However, the cutting becomes difficult beyond certain thickness or height-to-area aspect ratios. Furthermore, for axial-leaded diodes, mechanical (i.e., bending) stresses also place a structural restriction on the number of dies that may be used in a stack. As far as current carrying performance, increasing the die size (i.e., area) will increase its ability to pass higher currents. However, intrinsic defects in the bulk silicon wafer will increase the bulk reverse bias leakage current (which are responsible for thermal run away, as previously mentioned) for a given high voltage, in effect lowering the high voltage rating. This probability for such bulk HV leakage defects increases with die termination area. By extension to the whole diode stack, the probability for high voltage leakage therefore increases commensurately with the number of dies in the stack. It should be noted that one faulty/poor die in the stack may increase the stresses on the other dies, leading to a manufacturing reject of the whole assembly. That is, there may be no way to screen the individual junctions prior to assembly with silicon-based rectifiers. However, this is not the case for the above-described Sic diode die configuration. Rather, individual dies may be tested under points and thus screened for performance prior to integration.

However, the above-described SiC die array HV diode described above advantageously helps circumvent many of the above Si diode shortcomings. Several advantages may be realized when individual dies are arranged in a series array as described above. For example, the individual SiC diode dies 31 may be screened for performance (e.g., HV bulk leakage) prior to integration into the electronic device 30. Also, the die cutting operation is less likely to introduce problems, since a thinner (e.g., single) wafer is used. One example SiC diode die is a 2 kV PiN die which has an approximate thickness of 0.25 mm, although other dies with different voltage ratings or dimensions may also be used.

Additionally, with the SiC diode dies 31 spaced apart along the substrate 32, there is less "cross-heating". That is, the SiC diode die 31 assembly arrangement on the substrate 32 in effect increases the surface-to-volume ratio, and thus the overall heat dissipation. Another way to look at this is that each die 31*a*, 31*b* is in direct contact with the substrate 32, rather than being isolated by virtue of being in contact with other dies. As noted above, a conventional stacked silicon die arrangement is less tolerant of poorly performing individual dies (i.e., with increased bulk HV leakage currents), as they may unnecessarily heat up and thermally stress the adjoining dies. The substrate 32 may also be configured for enhanced heat dissipation (e.g., through the use of relatively high thermal conductivity Aluminum Nitride over Alumina).

The electronic device 30 may advantageously provide for enhanced mechanical integrity and high voltage creep management. For example, through-hole attachment of the radial leads 38*a*, 38*b* through the passageways 39*a*, 39*b* in the substrate 32 may improve mechanical integrity and reduce space-consuming lead bending to interconnected components. With respect to the wire bonding, the integrity of the wire bonds is a consideration given the relatively small dimensions of the wire used (e.g., on the order of a few thousandths of an inch). By way of example, gold, aluminum, or other suitable wires may be used, depending on the material compatibility with the SiC die terminations, which are "jumpered" from one die face (anode) to a "landing" (i.e., the conductive pads 34*a*, 34*b*) on the dielectric substrate 32. Even a slight force applied to the wires may cause a failure by breakage of the wire or its attachment (i.e., bond) point. The above-described encapsulants or coatings may advantageously help protect against such breakage. The encapsulant may advantageously be selected to match the coefficient of thermal expansion (CTE) of the wire bonded assembly, or alternately, be sufficiently soft/pliable so as to not mechanically stress the wire interconnects. Example encapsulant materials include SIFEL® brand potting gels. Other example materials may include dielectric gels, pottings with additives to raise the material CTE (e.g., Boron-Nitride filled Dow Corning Sylgard® 182, and conformal coatings (e.g., polyimide, chemical vapor deposited polyp-xylylene) polymers, etc.). The dielectric substrate can also be shaped so as to protect the wirebond (e.g., the wires may be recessed in a channel or trough).

Figure 6:
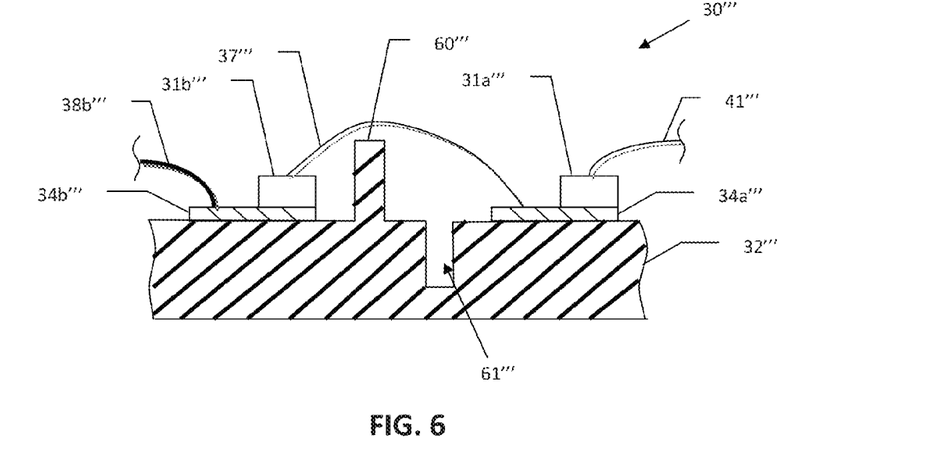
FIG. 6 is a schematic cross-sectional diagram of an embodiment of the electronic device shown in FIG. 1 with additional substrate surface features to reduce high voltage creep.

The geometry of the substrate 32 and packaging of the electronic device 30 may also advantageously be configured to provide desired HV creep performance. Referring additionally to FIG. 6, path lengthening techniques may be applied, including shaping the substrate 32''' to incorporate surface features such as pillars 60''' and/or trenches 61''' between the conductive pads 34*a*''', 34*b*'''. Other geometries may also be used, such as corrugations, grooves, etc. Generally speaking, the linear spacing between the SiC diode dies 31 may be in a range of about 0.5 to 2 mm, although other spacings may be used. Similarly, the linear path distance along the surface features may be roughly 1:1 with the linear distance between the SiC diode dies 31. So, for example, if two SiC diode dies 31 are linearly spaced 1 mm apart, the trench 61''' may have a depth of 0.5 mm, and the pillar 60''' may have a height of approximately 0.5 mm, although other relationships may be used in different embodiments.

Figure 10:
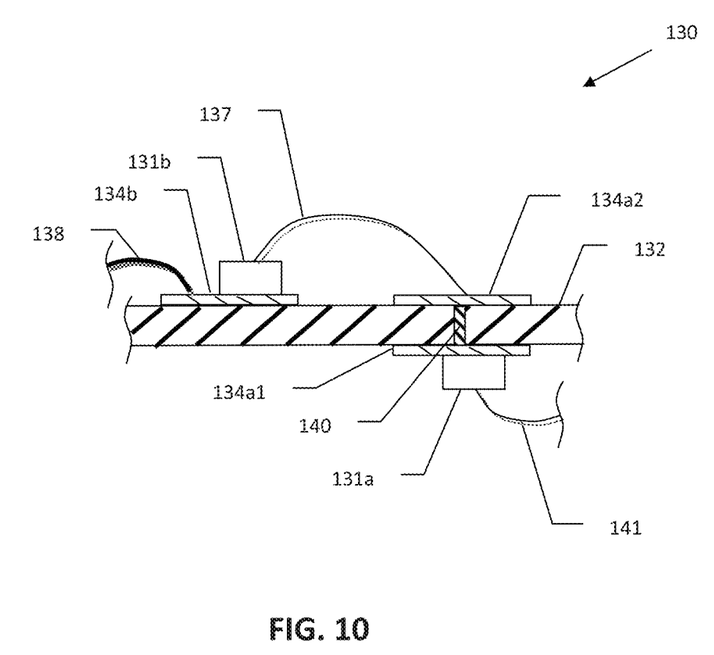
FIG. 10 is a schematic cross-sectional diagram of another embodiment of the electronic device of FIG. 1 in which SiC dies are positioned on top and bottom sides of the substrate.

In another example embodiment of the electronic device 130 described now with reference to FIG. 10, both sides (i.e., top and bottom sides) of a substrate 132 may have SiC diode dies 131*a*-131*b* mounted thereon. In the illustrated example, a solid filled (a.k.a. blind) via 140 is used to interconnect conductive pads 134*a*1, 134*a*2 so that the anode of the die 131*b* may be connected to the conductive pad 134*a*2 (and thus the cathode of the die 131*a* on the opposite side of the substrate 132) by wirebond 137 as shown. A wirebond 141 is connected to the anode of the die 141, and the conductive pad 134*b* has a lead 138 connected thereto. The via 140 may be a solder or braze filled hole about 0.5 mm in diameter, for example. This configuration may help increase the separation for high voltage tracking between the SiC diode dies 131*a*-131*b* while reducing package size. That is, the package size may be reduced through an appropriate spacing of one or more SiC dies on different sides of the substrate 132. For example, a zigzag layout of conductive pads may be used on each side of the substrate 132. In some embodiments, internal conductive traces may be used in the ceramic substrate 132 (e.g., HTCC or LTCC) instead of, or in addition to, the straight-through via 140 shown in FIG. 10.

A layered (i.e., multi-layer) Low Temperature Co-fired Ceramic (LTCC) or High Temperature Co-fired Ceramic (HTTC) insulating substrate approach may be used in the above-described embodiments, for example. Adequate cleanliness (i.e., surface preparation) is a consideration, particularly as the SiC diode die 31 spacing is reduced. As the overall diode voltage rating increases, the medium surrounding the diode (and dies) should desirably be more insulating to reduce arcing/flashover. While a conformal coating as discussed above may be beneficial in this regard, given that relatively small dimensions of SiC diode dies 31 may be used in the electronic device 30 (e.g., less than 1 mm), the appropriate electrically insulating coating may be selected to conform well to the features or geometries of the diode array. Moreover, such coatings may also be selected to match the CTE of the wire bonding and the application process to be mechanically compatible for the given implementation.

With respect to encapsulants or coatings, it is desirable that voids be avoided if possible, or kept away from the wirebonds (or SiC diode dies) to the extent such voids are created during the encapsulating or coating process. More particularly, during high voltage operation, if the wire bonds are surrounded by gas (e.g., air), the ejection of electrons into free space as a result of the localized corona effect may cause positively charged ions to sputter-erode the relatively thin wires and cause an electrical open circuit, which would cause a catastrophic failure of the device. Thus, even when encapsulants or coatings are used, any voids in these materials will entrap atmospheric air during the conformal application process, which may still allow the corona effect to occur in isolated regions despite the presence of the encapsulant or coating. Accordingly, the wettability/surface tension of the encapsulants or coatings to be used may be a consideration in certain embodiments. Vacuum potting techniques may also be used to help prevent the formation of such voids.

Figure 7:
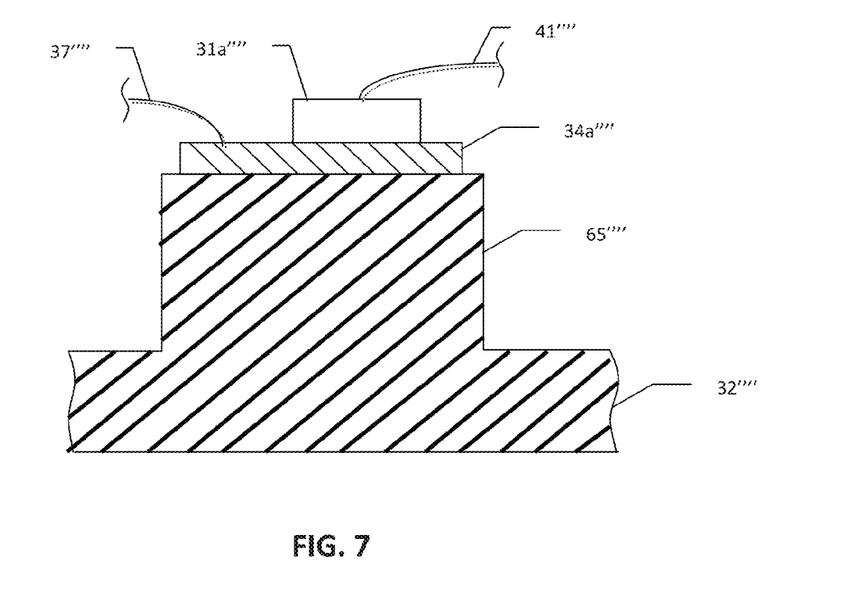
FIG. 7 is a schematic cross-sectional diagram of an embodiment of the electronic device of FIG. 3 in which an SiC diode die is elevated on a die pillar mount.

Turning additionally to FIG. 7, raised (e.g., promontory) features, such as a die pillar mounts 65"", may be formed on the substrate 32"" upon which the conductive pads and SiC diode die may be positioned or located. Such features may advantageously help increase the path length for HV creep. In some embodiments, the SiC diode dies and/or conductive pads may be positioned as close to the edges of the pillar mounts 65"" as possible to help prevent the collection of any encapsulant voids at these locations, for example.

For instances were voids are difficult to avoid, consideration may be given to performing the encapsulating process in an insulating (and chemically inert) gaseous atmosphere (e.g., $SF_6$), such that any resulting voids do not contain moist air, for example, provided the encapsulant curing is compatible with such atmosphere.

In some embodiments, the die termination may be configured to not unnecessarily expose the anode electrode terminals 35 of the opposing die faces to HV tracking (e.g., through retracted edge termination as shown in FIG. 3). A conductive epoxy may be used to attach the SiC diode dies to the respective conductive pads, and it should be carefully applied so as to not cover/contact the sides of the die and lead to electrical tracking. In another advantageous configuration, a cup-shaped cavity or trench may formed in the substrate 32 in which the SiC diode dies 31 are recessed to provide additional mechanical protection to the diode assembly, and optionally to better confine/contain the encapsulant, such as for an insulating liquid (oil), for example. In still another embodiment, the SiC diode dies may be mounted on separate substrates, and the substrates positioned one on top of the other so that the SiC diode dies are interdigitated without the use of problematic wirebonds (e.g., corona and or robustness problems).

In accordance with another configuration, the SiC diode dies 31 may be staggered in a non-axial (e.g., zigzag or offset) configuration so that more dies may fit within a relatively short substrate 32 length while maintaining desired linear spacing between the dies. Furthermore, it should be noted that other first and second lead configurations may be used besides the axial wire bond leads noted above (e.g., nail head leads, etc.).

Figure 8:
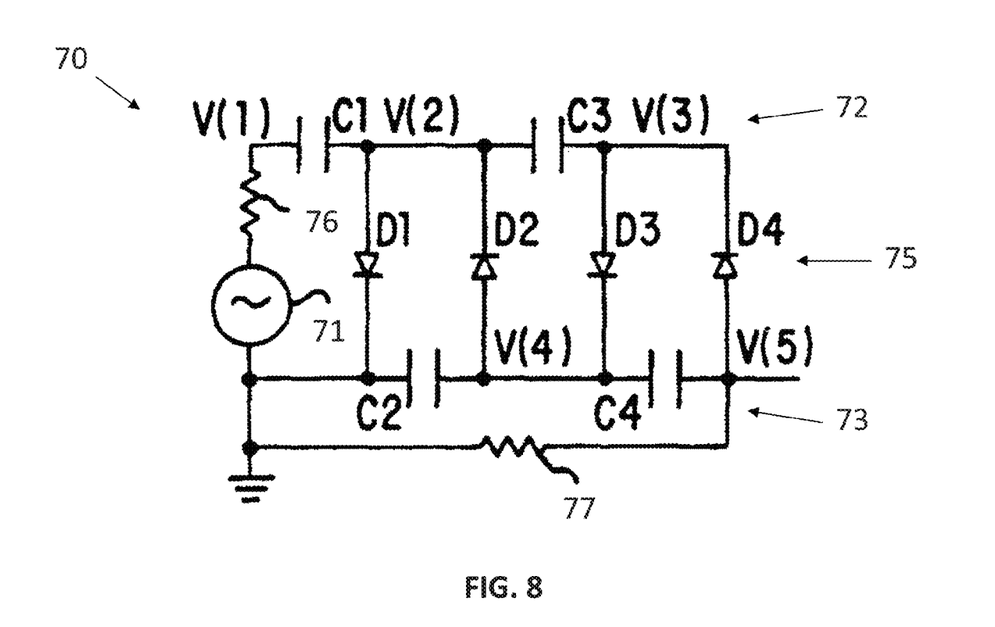
FIG. 8 is a schematic circuit diagram of an example voltage multiplier incorporating the electronic device FIG. 1 as a high voltage rectifier diode.

Turning now to FIG. 8, a two stage Cockcroft-Walton voltage multiplier 70 which advantageously incorporates the electronic device 30 (or variants thereof) described above converts a first AC voltage into a second, higher DC voltage. The Cockcroft-Walton voltage multiplier 70 illustratively includes an AC voltage drive source 71, two series capacitor banks 72, 73, and a diode matrix 75 which interconnects the capacitors. Capacitors C1 and C3 define the AC capacitive bank 72, and capacitors C2 and C4 define the DC capacitive bank 73. Diodes D1 through D4 are high voltage rectifiers, and in particular each of the diodes D1-D4 may comprise a respective electronic device 30 as described above. On positive peaks of the source voltage, diodes D1 and D3 conduct and D2 and D4 are reverse biased (off). At this time, capacitors C1 and C3 are charged. On negative voltage peaks D1 and D3 are off and D2 and D4 conduct, charging C2 and C4. The voltage drive source 71 has an impedance associated therewith, which is represented by a resistor 76, and the load for the voltage drive source is represented by a load resistor 77. Other voltage multiplier configurations which incorporate the electronic device 30 as high voltage rectifier diodes may also be used, such as a Villard cascade voltage multiplier, charge pumps, etc. As noted above, such devices may be incorporated in power supplies for wellbore logging tools, such as described in U.S. Pat. No. 5,191,517 to Stephenson, which is assigned to the present Assignee and is hereby incorporated herein in its entirety by reference.

One benefit of the electronic device 30 is that it advantageously allows for more compact high voltage power supplies with respect to silicon diode approaches. The scalability of the above-described configurations allows for the use of very high voltage diodes, which may translate to fewer stages in the Cockcroft-Walton voltage multiplier 70, or higher output voltage in the same size package. Given the diode high voltage rating is to match or exceed the stage voltage, the higher the voltage rating of the diodes used, the fewer the number of stages of the HV ladder that will achieve a given high voltage.

Figure 9:
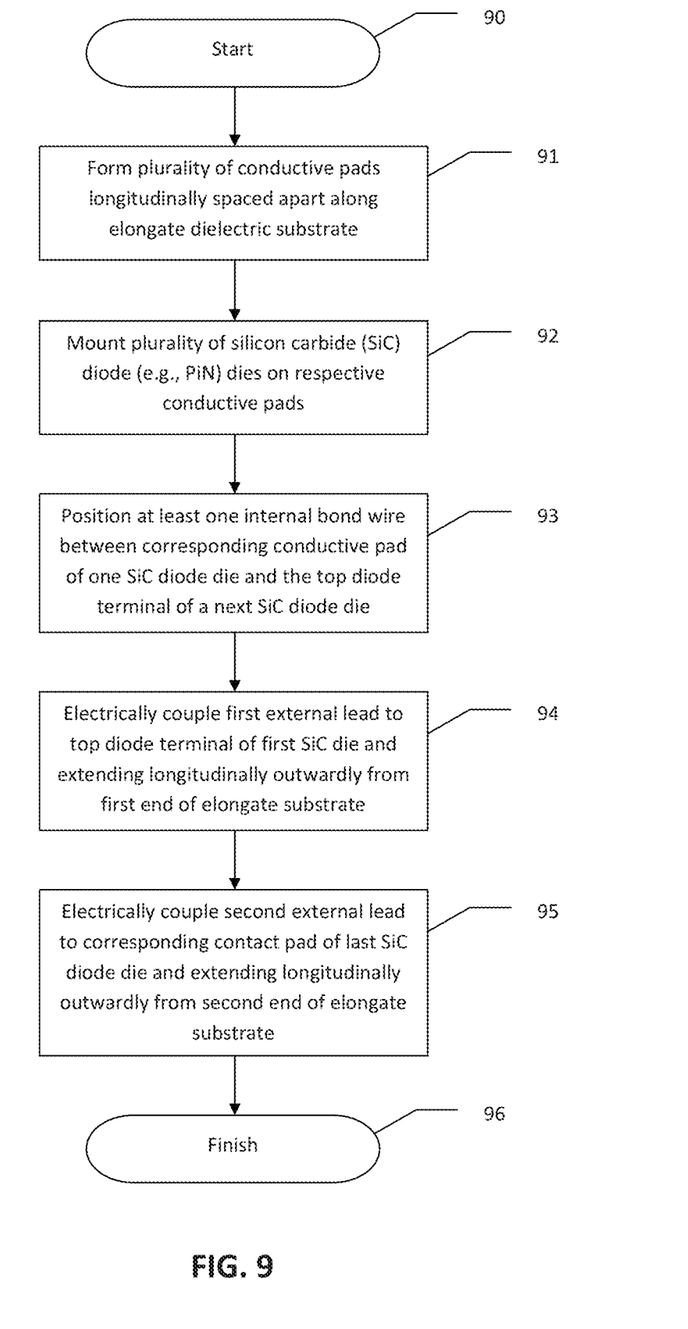
FIG. 9 is a flow diagram illustrating a method of making a high voltage diode.

A related method for making a high voltage diode, such as the electronic device 30, is now described with reference to the flow diagram 90 of FIG. 9. The method illustratively includes forming a plurality of conductive pads 34a, 34b (Block 91) longitudinally spaced apart along an elongated dielectric substrate 32, where the elongated dielectric substrate has opposing first and second ends 33a, 33b. The method further includes mounting a plurality of SiC diode dies 31a, 31b on respective conductive pads 34a, 34b, at Block 92, with each SiC die having bottom and top diode terminals 35, 36 and being mounted on a respective conductive pad with the bottom diode terminal in contact therewith. The method further includes positioning an internal wirebond (s) 37 between the corresponding conductive pad 34a of the SiC diode die 31a and the top diode terminal 36 of a next SiC diode die 31b, at Block 93. The method also includes electrically coupling a first external lead 38a to the top diode terminal 36 of the SiC diode die 31a and extending longitudinally outwardly from the first end 38a of the elongated substrate 32, at Block 94, and electrically coupling a second external lead 38b to the corresponding contact pad 34b of the SiC diode die 31b and extending longitudinally outwardly from the second end 33b of the elongated substrate, at Block 95, which illustratively concludes the method of FIG. 9 (Block 96). Additional method aspects will be understood from the description provided above.

Many modifications and other embodiments will come to the mind of one skilled in the art having the benefit of the teachings presented in the foregoing descriptions and the associated drawings. Therefore, it is understood that various modifications and embodiments are intended to be included within the scope of the appended claims.

That which is claimed is:

1. An electronic device comprising:
    an elongated dielectric substrate having opposing first and second ends, the first end of said elongated dielectric substrate having a first passageway therethrough, and the second end of said elongated dielectric substrate having a second passageway therethrough;
    a plurality of conductive pads longitudinally spaced apart along at least one surface of said elongated dielectric substrate;

a plurality of silicon carbide (SiC) diode dies, each SiC die having bottom and top diode terminals and being mounted on a respective conductive pad with the bottom diode terminal in contact therewith;

at least one internal wirebond between the corresponding conductive pad of one SiC diode die and the top diode terminal of a next SiC diode die;

a first external lead electrically coupled to the top diode terminal of a first SiC die and extending through the first passageway and longitudinally outwardly from the first end of said elongated dielectric substrate;

a second external lead electrically coupled to the corresponding contact pad of a last SiC diode die and extending through the second passageway and longitudinally outwardly from the second end of said elongated dielectric substrate; and a dielectric encapsulant surrounding said dielectric substrate, conductive pads, SiC diodes, and the at least one internal wirebond.

2. The electronic device of claim 1 wherein at least one of the conductive pads comprises a termination pad positioned on the substrate and coupled to said first external lead; and further comprising a wirebond coupled between said termination pad and the top terminal of said first SiC diode die.

3. The electronic device of claim 1 wherein said SiC diode dies comprise PiN diode dies.

4. The electronic device of claim 1 wherein said elongated dielectric substrate has at least one trench therein positioned between adjacent conductive pads.

5. The electronic device of claim 1 wherein said elongated dielectric substrate comprises at least one pillar positioned between adjacent conductive pads.

6. The electronic device of claim 1 wherein said elongated dielectric substrate comprises a plurality of spaced-apart die mounting pillars, each mounting a respective one of said SiC diode dies.

7. The electronic device of claim 1 further comprising a dielectric coating on said SiC diode dies and said at least one internal wirebond.

8. The electronic device of claim 1 further comprising an electrically insulating casing surrounding said elongated dielectric substrate and defining a vacuum therein.

9. The electronic device of claim 1 wherein said elongate dielectric substrate comprises a ceramic substrate.

10. The electronic device of claim 1 wherein said substrate has opposing top and bottom surfaces; and wherein the plurality of conductive pads are longitudinally spaced apart along opposing top and bottom surfaces of said substrate.

11. A voltage multiplier to convert a first voltage to a second, higher voltage, the voltage multiplier comprising:
an input to receive the first voltage and an output to output the second voltage;
a plurality of capacitors and high voltage diodes electrically connected in an alternating fashion between the input and the output, each high voltage diode comprising an elongated dielectric substrate having opposing first and second ends, the first end of said elongated dielectric substrate having a first passageway therethrough, and the second end of said elongated dielectric substrate having a second passageway therethrough,
a plurality of conductive pads longitudinally spaced apart along said elongated dielectric substrate
a plurality of silicon carbide (SiC) diode dies, each SiC die having bottom and top diode terminals and being mounted on a respective conductive pad with the bottom diode terminal in contact therewith, at least one internal wirebond between the corresponding conductive pad of one SiC diode die and the top diode terminal of a next SiC diode die,
a first external lead electrically coupled to the top diode terminal of a first SiC die and extending through the first passageway and longitudinally outwardly from the first end of said elongated dielectric substrate,
a second external lead electrically coupled to the corresponding contact pad of a last SiC diode die and extending through the second passageway and longitudinally outwardly from the second end of said elongated dielectric substrate, and
a dielectric encapsulant surrounding said dielectric substrate, conductive pads, SiC diodes, and the at least one internal wirebond.

12. The voltage multiplier of claim 11 wherein said elongated dielectric substrate has at least one trench therein positioned between adjacent conductive pads.

13. The voltage multiplier of claim 11 wherein said elongated dielectric substrate comprises at least one pillar positioned between adjacent conductive pads.

14. The voltage multiplier of claim 11 wherein said elongated dielectric substrate comprises a plurality of spaced-apart die mounting pillars, each mounting a respective one of said SiC diode dies.

15. The voltage multiplier of claim 11 further comprising a dielectric coating on SiC diodes and said at least one internal wirebond.

16. A method for making a high voltage diode comprising:
forming a plurality of conductive pads longitudinally spaced apart along an elongated dielectric substrate, the elongated dielectric substrate having opposing first and second ends, the first end of the elongated dielectric substrate having a first passageway therethrough, and the second end of the elongated dielectric substrate having a second passageway therethrough;
mounting a plurality of silicon carbide (SiC) diode dies on respective conductive pads, each SiC die having bottom and top diode terminals and being mounted on a respective conductive pad with the bottom diode terminal in contact therewith;
positioning at least one internal wirebond between the corresponding conductive pad of one SiC diode die and the top diode terminal of a next SiC diode die;
electrically coupling a first external lead to the top diode terminal of a first SiC die and extending through the first passageway and longitudinally outwardly from the first end of the elongated dielectric substrate;
electrically coupling a second external lead to the corresponding contact pad of a last SiC diode die and extending through the second passageway and longitudinally outwardly from the second end of the elongated dielectric substrate; and
encapsulating the dielectric substrate, conductive pads, SiC diodes, and the at least one internal wirebond.

17. The method of claim 16 further comprising forming at least one trench in the elongated dielectric substrate between adjacent conductive pads.

18. The method of claim 16 further comprising forming at least one pillar on the elongated dielectric substrate between adjacent conductive pads.

19. The method of claim 16 further comprising forming a plurality of spaced-apart die mounting pillars on the elongated dielectric substrate; and wherein mounting further comprises mounting a respective one of the SiC diode dies on each die mounting pillar.

* * * * *